United States Patent [19]

Sasaki

[11] Patent Number: 4,550,295
[45] Date of Patent: Oct. 29, 1985

[54] SWITCHED CAPACITOR INTEGRATOR

[75] Inventor: Itsuo Sasaki, Kawasaki, Japan

[73] Assignee: Tokyo Shibaura Denki Kabushiki Kaisha, Kawasaki, Japan

[21] Appl. No.: 647,280

[22] Filed: Sep. 5, 1984

Related U.S. Application Data

[63] Continuation of Ser. No. 394,612, Jul. 2, 1982, abandoned.

[30] Foreign Application Priority Data

Jul. 3, 1981 [JP] Japan ................... 56-104119

[51] Int. Cl.⁴ ........................................... H03H 11/00
[52] U.S. Cl. ..................................... 333/19; 333/173; 330/109
[58] Field of Search .................. 333/173, 172, 19; 330/107, 109

[56] References Cited

U.S. PATENT DOCUMENTS

| | | | |
|---|---|---|---|
| 3,814,957 | 6/1974 | Way | 307/310 |
| 4,004,164 | 1/1977 | Cranford, Jr. et al. | 307/362 |
| 4,100,437 | 7/1978 | Hoff, Jr. | 330/86 X |
| 4,260,946 | 4/1981 | Wheatley | 323/314 |
| 4,313,096 | 1/1982 | Fleischer | 333/173 |
| 4,333,064 | 6/1982 | Kato et al. | 333/173 |
| 4,378,538 | 3/1983 | Gignoux | 333/173 |

FOREIGN PATENT DOCUMENTS

3018500  5/1980  Fed. Rep. of Germany ...... 333/173

OTHER PUBLICATIONS

Gregorian, "Filtering Techniques with Switched-Capacitor Circuits", Microelectronics Journal, vol. 11, No. 2, Apr. 1980, pp. 13-21.

Bosshart, "A Multiplexed Switched Capacitor Filter Bank", IEEE Journal of Solid-State Circuits, vol. SC-15, No. 6 (Dec. 1980), pp. 939-945.

*Primary Examiner*—Eugene R. LaRoche
*Assistant Examiner*—Benny T. Lee
*Attorney, Agent, or Firm*—Finnegan, Henderson, Farabow, Garrett & Dunner

[57] ABSTRACT

A switched capacitor integrator is comprised of an operational amplifier, a feedback capacitor connected between the inverting input terminal and the output terminal of the amplifier, a bias circuit for applying a given voltage to the non-inverting input terminal of the amplifier, a switched capacitor, and a switch circuit which connects the switched capacitor between the signal input terminal applied with an input voltage signal and the inverting input terminal of the amplifier in a first operation mode and short-circuits the switched capacitor in a second operation mode.

3 Claims, 16 Drawing Figures

FIG. 7
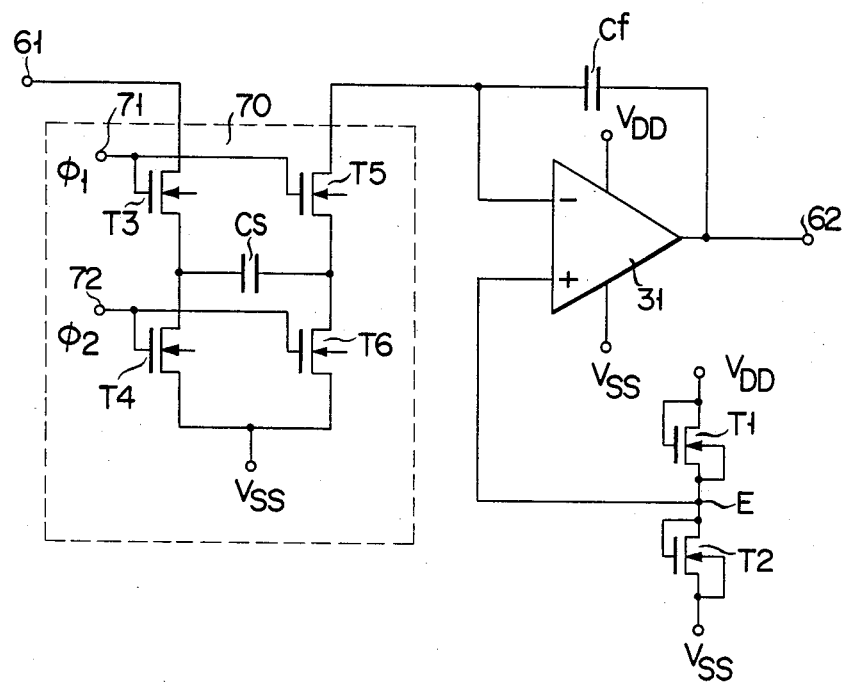
FIG. 8A $\phi_1$
FIG. 8B $\phi_2$
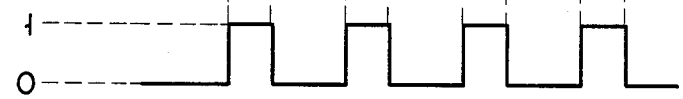

F I G. 11
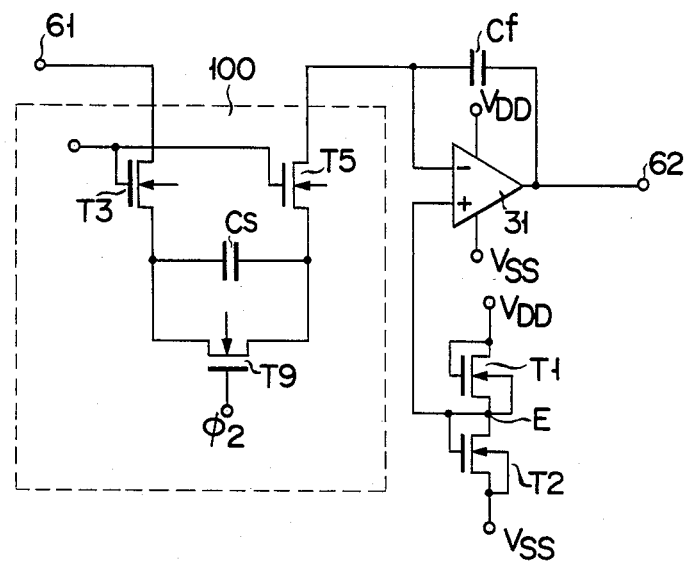
F I G. 12
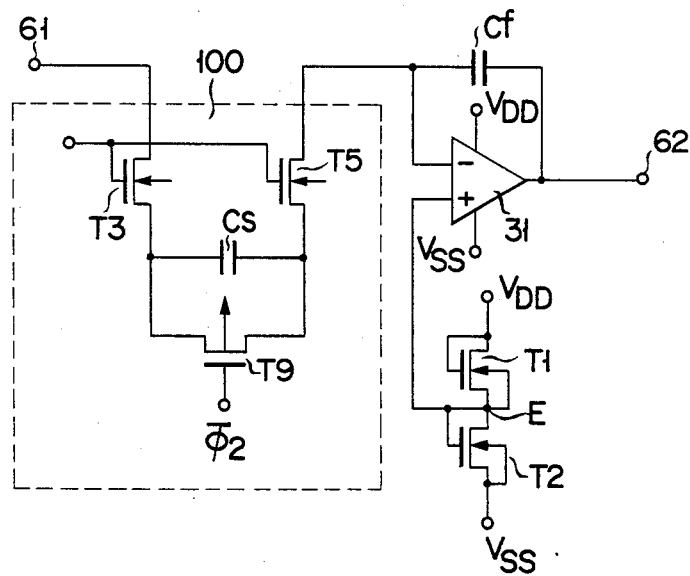

SWITCHED CAPACITOR INTEGRATOR

This application is a continuation of application Ser. No. 394,612, filed July 2, 1982, now abandoned. Copending U.S. patent application Ser. No. 394,613 to Sasaki et al., filed July 2, 1982, is noted for cross-reference purposes.

BACKGROUND OF THE INVENTION

The present invention relates to a switched capacitor integrator for use in electronic filters, voice recognition circuits and voice composing circuits.

FIGS. 1A and 1B show a basic circuit of a switched capacitor circuit and FIG. 2 shows its equivalent circuit. In these figures, a switch S is connected at the first stationary contact a to the input terminal 11, and at the secondary stationary contact b to the output terminal 12. A common contact c is connected through a capacitor Cs to ground. Potentials Vi and Vo with respect to ground potential are applied to the input and output terminals, respectively. As shown in FIG. 1A, when the switch S is turned to the contact a, the charge Q1 stored in the capacitor Cs is given by $Q1 = Cs \times Vi$. When it is turned to the contact b, as shown in FIG. 1B, the charge Q2 stored in the capacitor Cs is expressed by $Q2 = Cs \times Vo$. The switching operation of the switch S from the input terminal 11 to the output terminal 12 is equivalent to the movement of $\Delta Q$ from the input terminal 11 to the output terminal 12. $\Delta Q$ is $$\Delta Q = Q1 - Q2 = Cs(Vi - Vo) \quad (1)$$

When the switch S is switched $f_s$ times per second, an average current i flowing from the input terminal 11 to the output terminal 12 is given $$i = \Delta Q \cdot f_s = Cs(Vi - Vo)f_s \quad (2)$$

If the switching frequency $f_s$ of the switch S is sufficiently larger than the frequencies of the voltages Vi and Vo, the current i is equal to the current determined by the instantaneous values of the voltages Vi and Vo. Accordingly, the circuit shown in FIGS. 1A and 1B is equivalent to a circuit with a resistor connected between the input and output terminals 11 and 12. Here, the resistor R is given $$R = \frac{Vi - Vo}{i} = \frac{1}{Cs \cdot f_s} \quad (3)$$

As described above, in the switched capacitor circuit, the capacitor Cs connected at one end to the reference potential is switched at the other end between two different potential terminals. Equivalently, the resistor R is connected between the two potential terminals. The switched capacitor is the integrator formed by using the switched capacitor circuit.

FIG. 3 shows a mirror integrator formed using the operational amplifier 31 and its input vs. output characteristic is mathematically expressed by the following equation $$\frac{Vo}{Vi} = -\frac{1}{S \cdot Rs \cdot Cf} \quad (4)$$

where Vi is an input voltage, Vo an output voltage and Rs a resistance of an input resistor between the input terminal 11 and the inverting input terminal (−) of the amplifier 31, Cf a capacitance of a feedback capacitor connected between the output terminal and the inverting input terminal (−) of the amplifier 31, and S is the Laplacian transform.

In FIG. 3, $V_{DD}$ and $V_{SS}$ are power sources, and the non-inverting input terminal (+) of the amplifier 31 is connected to ground.

FIG. 4 shows a mirror integrator formed using the switched capacitor circuit 41 in place of the resistor Rs in the circuit shown in FIG. 3. The input vs. output characteristic of the circuit 41 is such that the R in the equation (3) is substituted into the Rs in the equation (4), and is given $$\frac{Vo}{Vi} = -\frac{f_s}{S(Cf/Cs)} \quad (5)$$

As seen from the equation (5), the input vs. output characteristic of the mirror integrator is a linear function of a capacitance ratio of the capacitances Cs and Cf, and the switching frequency $f_s$ of the switch S. This indicates that the integration time constant may be changed proportional to the frequency $f_s$, and that the filter formed using the mirror integrator shown in FIG. 4 can switch the filtering frequency proportional to the switching frequency $f_s$.

FIGS. 5A and 5B show mirror integrators equivalent to the mirror integrator shown in FIG. 4. In the mirror integrators shown in these figures, switched capacitor circuit 50 is each provided with two switches S1 and S2. Both ends of the capacitor Cs can simultaneously be switched by the switches S1 and S2. The first stationary contact a1 of the switch S1 is connected to the input terminal 11; the secondary stationary contact b1 to ground; and the common contact to one end of the capacitor Cs. The first stationary contact a2 of the switch S2 is connected to the inverting input terminal (−) of the amplifier 31; the second stationary contact b2 to ground; and the common contact to the other terminal of the capacitor Cs. Incidentally, in the mirror integrators, the switched capacitor circuit is used as an equivalent resistor with a positive resistance.

When the switches S1 and S2 are turned to the stationary contacts b1 and b2, respectively, as shown in FIG. 5A, the charge of the capacitor Cs is discharged to zero. As shown in FIG. 5B, when the switches S1 and S2 are connected to the stationary contacts a1 and a2, respectively, as shown in FIG. 5B, the charge Q given by the following equation is stored in the capacitor Cs.

$$Q = Cs(Vi - Vi') \quad (6)$$

where Vi is a voltage applied to the terminal 11 and Vi' is a voltage applied to the inverting input terminal (−) of the amplifier 31.

The average current i of the capacitor Cs is given by $$i = Cs(Vi - Vi')f_s \quad (7)$$

where $f_s$ is the switching frequency of the switches S1 and S2. Further, the equivalent resistance R between the stationary contacts a1 and a2 is $$R = \frac{Vi - Vi'}{i} = \frac{1}{Cs \cdot f_s} \quad (8)$$

The equation (8) is the same as the equation (3). The switched capacitor circuit 50 shown in FIGS. 5A and 5B is equivalent to the switched capacitor circuit 41 shown in FIG. 4.

As shown in FIGS. 4, 5A and 5B, the switched capacitor integrator used as the mirror integrator requires a single source terminal connected to a reference power source Vref (ground) in addition to the two power source terminals connected to the two power sources $V_{DD}$ and $V_{SS}$ for the amplifier. For this reason, when the switched capacitor integrator, together with the ordinary random logic using two power sources ($V_{DD}$, $V_{SS}$), is fabricated into a single device, there is required a further terminal for the reference power source in addition to the two power source terminals. The increase of the number of the power source terminals provides a great problem in integrated circuit fabrication for the following reasons. The circuit becomes complicated and a longer time must be taken for the circuit design. The chip area is increased and its patterning is complicated because three power source terminals must be used. Further, design of the printed circuit board for containing the integrated circuits becomes complicated, resulting in increase of the cost to manufacture.

SUMMARY OF THE INVENTION

Accordingly, an object of the present invention is to provide a switched capacitor integrator which is suitable for integrated circuit fabrication by decreasing the number of the power sources and hence the number of the power source terminals.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

According to the present invention, there is provided a switched capacitor comprising first and second power sources, first and second power source terminals connected to said first and second power sources respectively, an operational amplifier driven by the first and second power sources and having an inverting input terminal, a non-inverting input terminal, and an output terminal, feedback capacitor means connected between the inverting input terminal and the output terminal of the operational amplifier, bias circuit means connected between the first and second power source terminals and driven by said first and second power sources for providing a given bias voltage to the non-inverting input terminal of the operational amplifier means, switched capacitor means, switching means for connecting the switched capacitor between a signal input terminal applied with an input voltage signal and the said inverting input terminal of the operational amplifier means in a first operation mode and short-circuiting the switched capacitor in a second operation mode.

The accompanying drawings, which are incorporated in and constitute a part of this specification, illustrate embodiments of the invention and, together with the description, serves to explain the principles of the invention.

BRIEF DESCRIPTION OF THE DRAWINGS

FIG. 7 shows a detailed circuit diagram of the integrator shown in FIGS. 6A and 6B;

FIGS. 8A and 8B show timing charts of clock pulses applied to the integrator shown in FIG. 7; and FIGS. 9 to 12 show circuit diagrams of other embodiments of an integrator of the present invention.

DETAILED DESCRIPTION OF THE PREFERRED EMBODIMENTS

Figure 6A:
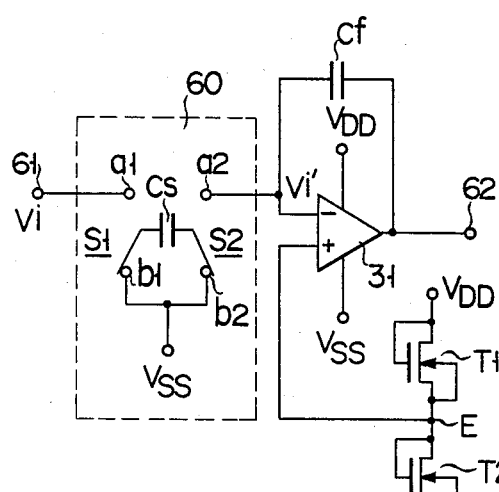
FIGS. 6A and 6B show circuit diagrams of an embodiment of a switched capacitor integrator according to the present invention.
Figure 6B:
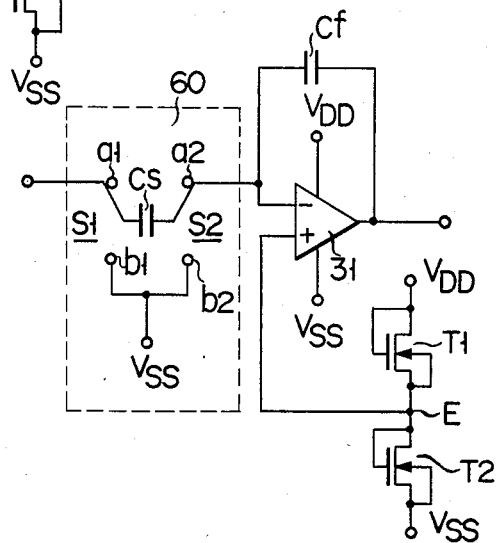

In a switched capacitor integrator according to the present invention as shown in FIGS. 6A and 6B, a switched capacitor circuit 60 is provided with two selecting switches and a switched capacitor Cs. Common contacts of the switches S1 and S2 are connected to one end and the other end of the capacitor Cs, respectively. The first stationary contact a1 of the switch S1 is connected to the input terminal 61 and an input voltage Vi is applied to the input terminal 61. The first stationary contact a2 of the switch S2 is connected to the inverting input terminal (−) of an operational amplifier 31. A voltage Vi' is applied to the inverting input terminal. The second stationary contacts b1 and b2 of the switches S1 and S2 are connected together to the power source $V_{SS}$.

The operational amplifier 31 is connected to the power sources $V_{DD}$ and $V_{SS}$ as drive sources. The output terminal of the amplifer 31 is connected to the output terminal 62 of the device and through a feedback capacitor Cf to the inverting input terminal (−) of the amplifier 31. A predetermined or given voltage $V_E$ between the voltages $V_{DD}$ and $V_{SS}$ is applied to the non-inverting input terminal (+) of the amplifier 31, and this voltage $V_E$ is selected according to the characteristics of the amplifier 31.

In the present embodiment, the voltage $V_E$ is formed by a resistive voltage division of the $V_{DD}$ and $V_{SS}$ voltages into a preferred value between the voltages $V_{DD}$ and $V_{SS}$, not by providing an additional power source. For forming the voltage $V_E$ between the power source voltages $V_{DD}$ and $V_{SS}$, the drain of the N channel MOS (metal oxide semiconductor) transistor T1 of which the gate and drain are interconnected is connected to the power source voltage $V_{DD}$, and the source of the N channel MOS transistor T2 of which the gate and drain are interconnected is connected to the power source voltage $V_{SS}$, the drain of the transistor T2 is connected to the source of transistor T1. With this circuit connection, a resistive voltage divider circuit or a bias circuit is formed. The junction "E" between the source of the transistor T1 and the drain of the transistor T2 is connected to the non-inverting input terminal (+) of the amplifier 31. For setting the voltage $V_E$ at $(V_{DD}-V_{SS})/2$, the characteristics of the transistors T1 and T2 must be substantially identical to each other.

The operation of the switched capacitor integrator will be described referring to FIG. 6.

Assume now that the switches S1 and S2 respectively are set to the second contacts b1 and b2, as shown in FIG. 6A. The capacitor Cs is connected at both ends to the power source voltage $V_{SS}$, and its charge is discharged to zero. This state is the same as that in FIG. 5A. As shown in FIG. 6B, when the switches S1 and S2 are turned to the first contacts a1 and a2, respectively, the capacitor Cs stores the following charge.

$$Q = Cs(Vi - Vi') \quad (9)$$

where Vi is a voltage applied to an input terminal 61, and Vi' is a voltage applied to the inverting input terminal (−) of the amplifier 31. The average current i flowing through the capacitor Cs is $$i = Cs(Vi - Vi')f_s \quad (10)$$

And its equivalent resistance is $$R = \frac{Vi - Vi'}{i} = \frac{1}{Cs \cdot f_s} \quad (11)$$

Figure 1A:
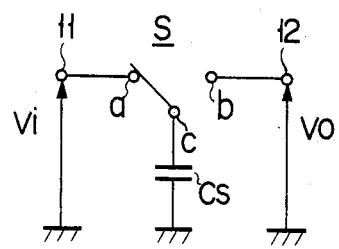
FIGS. 1A and 1B are circuit diagrams of a basic switched capacitor circuit.
Figure 1B:
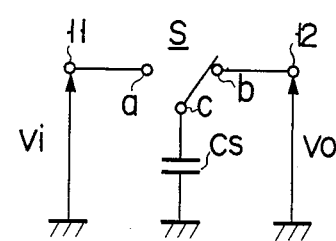
Figure 2:
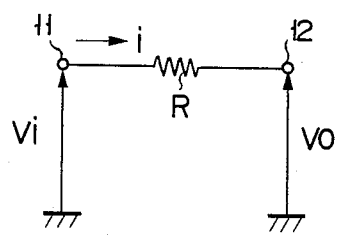
FIG. 2 shows an equivalent circuit of the switched capacitor circuit shown in FIGS. 1A and 1B.
Figure 3:
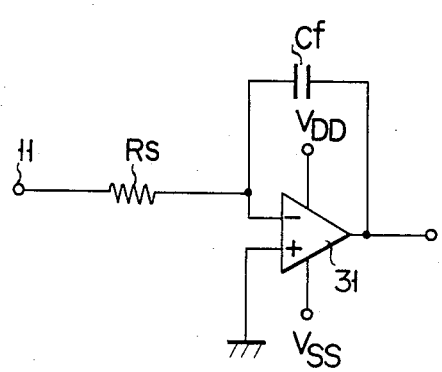
FIGS. 3 and 4 show circuit diagrams of prior mirror integrators.
Figure 4:
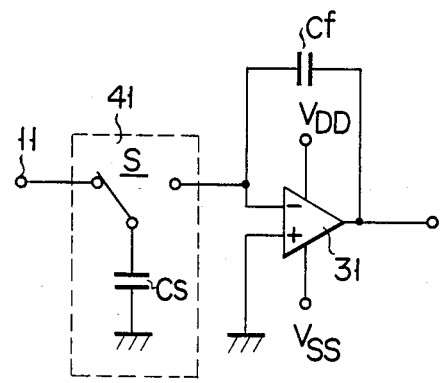

The equation (11) is equal to the equation (3). The switched capacitor integrator shown in FIGS. 6A and 6B has the same function as that of the switched capacitor integrator shown in FIGS. 5A and 5B. This implies that the input-output characteristic of the integrator shown in FIGS. 6A and 6B, like the input-output characteristic as given in equation (5) of the FIG. 4 integrator, is expressed by $$\frac{V_o}{V_i} = \frac{f_s}{S(Cf/Cs)}$$

Figure 5A:
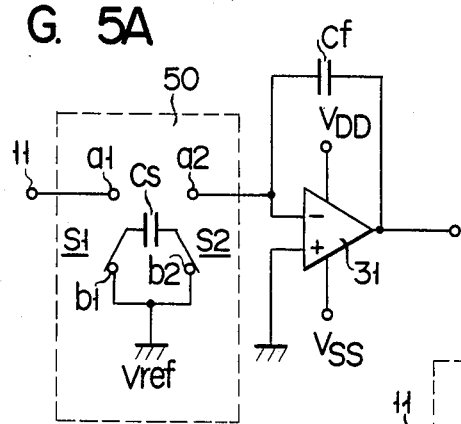
FIGS. 5A and 5B show circuit diagrams of prior switched capacitor integrators.
Figure 5B:
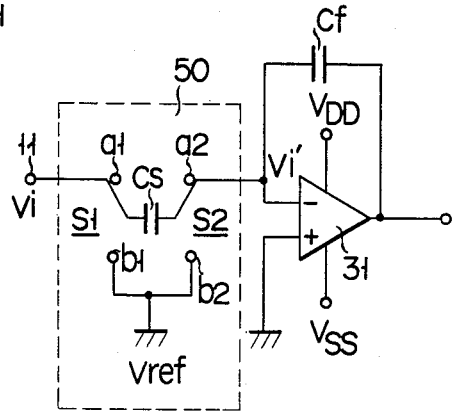

As seen from the equation, even if the reference power source voltage Vref connected to the switched capacitor circuit 50 in the integrator of FIGS. 5A and 5B is replaced by the power source voltage $V_{SS}$ connected to the amplifier 31, as shown in FIGS. 6A and 6B, the circuit under discussion is operable as an integrator by employing an arrangement where the proper value of voltage between the voltages $V_{DD}$ and $V_{SS}$ is applied to the non-inverting terminal (+).

FIG. 7 shows an example where the switched capacitor 60 circuit of the switched capacitor integrator shown in FIG. 6 is fabricated into an integrated circuit. In the switched capacitor circuit 70, transistors T3 to T6 are MOS transistors of the N channel type, as is the case of the transistors T1 and T2. The transistor T3 serving as a first switch circuit and the transistor T4 as a second switch circuit correspond to the select switch S1 in the circuit shown in FIGS. 6A and 6B. The transistor T5 as a third switch circuit and the transistor T6 as a fourth switch circuit correspond to the switch S2 in the circuit shown in FIGS. 6A and 6B. Two gate control pulses $\phi_1$ and $\phi_2$, as shown in FIGS. 8A and 8B are used to control the switching of transistors T3, T5 and T4, T6, respectively, such that the transistors T3, T5 and the transistors T4, T6 are in opposite switched states. The drain of the transistor T3 is connected to the input terminal 61 and the source of the transistor T4 is coupled to the power source voltage $V_{SS}$. A junction between the source of the transistor T3 and the drain of the transistor T4 is connected to one end of the capacitor Cs. The drain of the transistor T5 is connected to the inverting input terminal (−) of the amplifier 31. The source of the transistor T6 is connected to the power source voltage $V_{SS}$. A junction between the source of the transistor T5 and the drain of the transistor T6 is connected to the other end of the capacitor Cs. Both the gates of the transistors T3 and T5 are connected to the clock input terminal 71. The gates of the transistors T4 and T6 are both connected to the clock input terminal 72.

Clock pulses $\phi_1$ and $\phi_2$ as shown in FIGS. 8A and 8B are applied to the clock input terminal 71 and 72, respectively. These clock pulses have each a period of $1/f_s$ and their "1" level durations are not overlapped. Therefore, when $\phi_1 = $ "0" and $\phi_2 = $ "1", the transistors T3 and T5 are OFF and the transistors T4 and T6 are ON. This state is the same as that of the FIG. 6A circuit. When $\phi_1 = $ "1" and $\phi_2 = $ "0", the transistsors T3 and T5 are ON and the transistors T4 and T6 are OFF. This state is identical with that of the FIG. 6B circuit.

In the circuit shown in FIG. 7, the transistors T3 to T6 are used for the first to fourth switch circuits in one-to-one manner. Alternatively, an analog switch such as a transmission switch, for example, a transmission gate, can be used for the same purpose.

Figure 9:
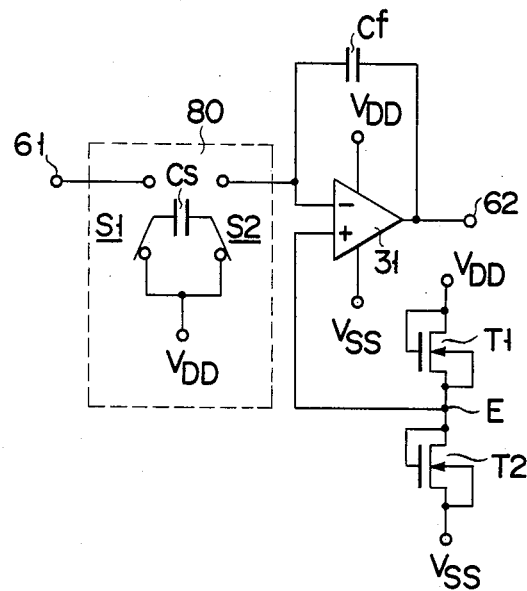
Figure 10:
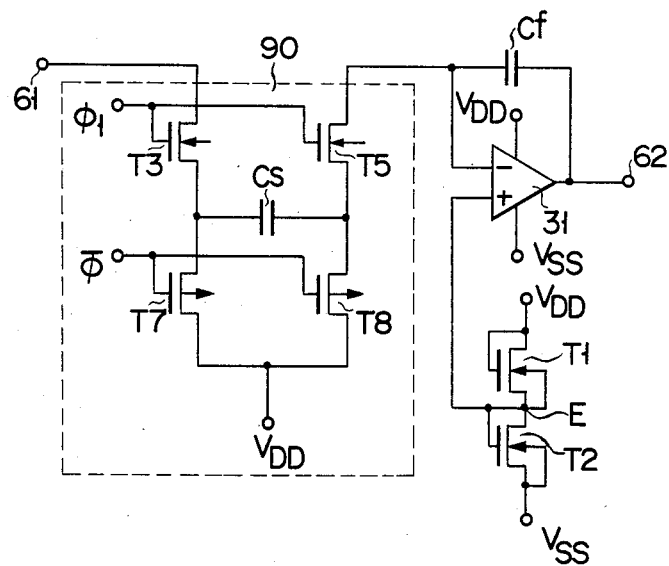

In the above-mentioned embodiment, for discharging the charge stored in the capacitor Cs to zero, a pull-down arrangement is employed by connecting both ends of the capacitor Cs to the power source voltage $V_{SS}$. Alternatively, a pull-up arrangement may be employed by connecting the capacitor Cs to the power sourve $V_{DD}$. For applying this pull-up arrangement to the circuit shown in FIGS. 6A and 6B, the power source $V_{DD}$ is merely connected to the switched capacitor 80, as shown in FIG. 9. For modifying the circuit shown in FIG. 7 into the pull-up arrangement, N-channel transistors T3 and T5 are used for the first and third switch circuits of the switched capacitor circuit 90, and P channel transistors T7 and T8 are used for the second and fourth switch circuits, as shown in FIG. 10. The power source $V_{DD}$ is connected to the transistors T7 and T8, and the phase-inverted clock pulse $\overline{\phi_2}$ is applied to the gates of the transistors T7 and T8. In this case, when the clock pulses $\overline{\phi_2}$ and $\phi_1$ are both "0", the transistors T3 and T5 are OFF and the transistors T7 and T8 are ON. As a result, both the ends of the capacitor Cs are connected to the power source voltage $V_{DD}$, effecting the discharge.

FIG. 11 shows another emboidment of a switched capacitor circuit according to the present invention. In the present embodiment, the switched capacitor circuit 100 is not connected to the power sources $V_{DD}$ and $V_{SS}$. In the present embodiment, the transistors T4 and T6 in the FIG. 7 circuit and the transistors T7 and T8 in the FIG. 9 circuit are removed. A transistor of the N-channel type, for example, is connected in parallel with the capacitor Cs and the clock pulse $\overline{\phi_2}$ is applied to the gate of the transistor T9. When the transistor T9 is turned on by the clock pulse $\phi_2$, the capacitor Cs is short-circuited and discharged to zero through the drain-source path of the transistor T9.

As shown in FIG. 12, a transistor of the P-channel type, instead of the N-channel type, can be used for the transistor T9. In this case, the phase inverted pulse $\overline{\phi_2}$ is applied to its gate. With this arrangement, when the transistor T9 is turned ON by the clock pulse $\phi_2$, the capacitor Cs is short-circuited. Then, an electric current flows through the drain-source path of the transistor T9 to discharge the charge stored the capacitor Cs to zero.

The above-mentioned embodiments employ the same type bias circuit for applying the voltage $V_E$, for example, $(V_{DD} - V_{SS})/2$, to the non-inverting input terminal of the amplifier 31. This bias circuit may of course be substituted by any other suitable circuit, as a voltage drop circuit with small current consumption. When an amplifier using a MOS transistor as its first stage is used for the amplifier 31, the input impedance at the non-inverting input terminal (+) is almost infinite. Accordingly, a circuit with a high input impedance can be used as the bias circuit for producing the voltage $V_E$. Such circuit can reduce the current consumption and for this reason is suitable for integrated circuit fabrication.

The voltage $V_E$ at the junction E between the transistors T1 and T2 shown in FIGS. 6A and 6B correspond to the reference voltage Vref in the prior art device. Therefore, one might presume that the non-inverting input terminal (+) of the amplifier 31 and the switched capacitor circuit 50 (FIG. 5) can be connected to the junction E having the potential $V_E$ between the transistors T1 and T2, not to the reference potential Vref. This presumption, however, is not correct. If so done, in charging the switched capacitor circuit 50, the charge Q given by $Q=C_S(Vi-Vi')$ is stored in the capacitor Cs, and at the time of discharge, the capacitor Cs is discharged to the voltage $V_E$. The voltage $V_E$ is not equal to the power source voltage, but is a voltage having a higher impedance and between the power source voltages $V_{DD}$ and $V_{SS}$. For this reason, the voltage $V_E$ is likely to change slightly at the time of discharge. More specifically, when the voltage Vi at the input terminal 11 is higher than the voltage $V_E$, and when the switches S1 and S2 are turned from the stationary contacts a1 and a2 to the contacts b1 and b2, that is to say, when the both ends of the capacitor Cs are switched from the input terminal 11 and the inverting input terminal (−) of the amplifier 31 to the contacts b1 and b2, the voltage $V_E$ at the junction E would temporarily rise. This potential rise pulls up the voltage at the output terminal of the amplifier 31, causing a change of the integration constant. This is a serious problem in an integrator. For avoiding this problem in a prior art integrator, assuming the reference voltage Vref is replaced by the voltage $V_E$ produced by the bias circuit including the transistors T1 and T2 and the power source voltages $V_{DD}$ and $V_{SS}$, the bias circuit must have a low output impedance. However, the low impedance circuit allows a large amount of current to flow therethrough. Accordingly, such a circuit is not suitable for integrated circuit fabrication.

As described above, in the switched capacitor circuit according to the present invention, the power source voltage for the amplifier is connected to the discharge path of the switched capacitor circuit, or the MOS transistors turned ON or OFF by the clock pulses are connected in parallel with the switched capacitor. Further, the bias circuit using the power source voltage for the amplifier is employed for applying the bias voltage to the non-inverting input terminal of the amplifier. With this arrangement, the number of the power sources and thus the number of the power source terminals is reduced. In this respect, the switched capacitor integrator is suitable for integrated circuit fabrication.

While the present invention has been described using specific embodiments, the present invention may variously be modified and changed within the spirit of the present invention.

What is claimed is:

1. A switched capacitor integrator comprising:
   only first and second power sources;
   only first and second power source terminals connected to said first and second power sources, respectively;
   operational amplifier means driven by said first and second power sources and having an inverting input terminal, a non-inverting input terminal, and an output terminal;
   feedback capacitor means connected between said inverting input terminal and said output terminal of said operational amplifier means;
   bias circuit means connected between said first and second power source terminals and driven by said first and second power sources for providing a given bias voltage to said non-inverting input terminal of said operational amplifier means;
   switched capacitor means separated from the non-inverting input terminal of said operational amplifier means; and
   switching means for connecting said switched capacitor means between a signal input terminal applied with an input voltage signal and said inverting input terminal of said operational amplifier means in a first operation mode and connecting both ends of said switched capacitor means to one of said first and second power source terminals in a second operation mode.

2. A switched capacitor integrator according to claim 1, in which said bias circuit means includes first and second transistors connected in series between said first and second power source terminals, and a junction between said first and second transistors connected to said non-inverting input terminal of said amplifier means so as to apply said given bias voltage to the non-inverting input terminal.

3. A switched capacitor integrator according to claim 1, in which said switching means includes a first transistor switch connected between said signal input terminal and one end of said switched capacitor means and turned on or off by a first clock pulse, a second transistor switch connected between said one end of said switched capacitor means and said first power source terminal and turned on or off by a second clock pulse of which the pulse period does not overlap with that of the first clock pulse, a third transistor switch connected between the other end of said switched capacitor means and said inverting input terminal of said amplifier means and turned on or off by said first clock pulse, and a fourth transistor connected between said other end of said switched capacitor means and said first power source terminal and turned on or off by said second clock pulse.

* * * * *